US008513663B2

(12) United States Patent
Buehler et al.

(10) Patent No.: US 8,513,663 B2
(45) Date of Patent: Aug. 20, 2013

(54) SIGNAL REPOWERING CHIP FOR 3-DIMENSIONAL INTEGRATED CIRCUIT

(75) Inventors: Markus Buehler, Boeblingen (DE); Sebastian Ehrenreich, Boeblingen (DE); Juergen Koehl, Nuremberg (DE)

(73) Assignee: International Business Machines Corporation, Armonk, NY (US)

( * ) Notice: Subject to any disclaimer, the term of this patent is extended or adjusted under 35 U.S.C. 154(b) by 635 days.

(21) Appl. No.: 12/754,054

(22) Filed: Apr. 5, 2010

(65) Prior Publication Data

US 2010/0237700 A1  Sep. 23, 2010

(30) Foreign Application Priority Data

Apr. 18, 2009 (GB) .................................. 0906740.6

(51) Int. Cl.
*H01L 23/58* (2006.01)
*H01L 29/10* (2006.01)

(52) U.S. Cl.
USPC .............................. 257/48; 257/691; 257/777

(58) Field of Classification Search
USPC ..................... 257/685, 691, 777, 48; 326/38; 365/222; 710/310
See application file for complete search history.

(56) References Cited

U.S. PATENT DOCUMENTS

| 5,440,182 | A | * | 8/1995 | Dobbelaere | 326/38 |
| 2004/0037141 | A1 | * | 2/2004 | Raad | 365/222 |
| 2006/0095639 | A1 | * | 5/2006 | Guenin et al. | 710/310 |

OTHER PUBLICATIONS

Sai-Halasz, George A., Proceedings of the IEEE, vol. 83, No. 1, Jan. 1995.

* cited by examiner

*Primary Examiner* — Kimberly Rizkallah
*Assistant Examiner* — Errol Fernandes
(74) *Attorney, Agent, or Firm* — David A. Cain

(57) ABSTRACT

A signal repowering chip comprises an input; at least one inverter connected in series to the input; and at least one switch connected to a test enable signal, the at least one switch configured to allow a signal connected to the input to propagate through the at least one inverter in the event that the test enable signal is on. A 3-dimensional integrated circuit comprises a first chip, the first chip comprising a default voltage level and a plurality of wiring layers; and a second chip, the second chip comprising at least one repeater, the repeater being connected to the default voltage level.

5 Claims, 5 Drawing Sheets

US 8,513,663 B2

SIGNAL REPOWERING CHIP FOR 3-DIMENSIONAL INTEGRATED CIRCUIT

BACKGROUND

This disclosure relates generally to the field of 3-dimensional integrated circuit design.

Integrated circuits (ICs) are becoming increasingly more complex in design in function. 3-dimensional integrated circuits (3D ICs) are designed to increase the amount of available resources in an IC, allowing for more complex function. A 3D IC comprises two or more chips connected directly to each other. The connection may be either face-to-face or bottom-to-top. Chips used in a 3D IC may comprise any type of circuit structure; however, if the two chips are designed to be interconnected, it may not be possible to test the chips before they are attached to each other. After the chips are attached to each other to form the 3D IC, the chips may not be separated without damaging the chips. This may result in a low yield of working final 3D ICs, as a good bottom chip may be attached to a bad chip before testing. For example, if a top chip and a bottom chip each have a typical 30% yield of good chips from manufacturing, after connecting randomly selected chips, the final 3D IC will have a 9% yield (30% of 30%), tripling production costs of the 3D IC.

The number of wiring layers in an IC increases with the complexity of the IC, as the silicon density of the IC is limited by the amount of available wiring resources. However, increasing the number of wiring layers may have limited benefits as wires located on an upper wiring layer need to be re-powered by a buffer with pins on a bottom layer. Vias are used to connect an upper wiring layer to any lower wiring layers, blocking wiring channels on the wiring layers in between. The vias required for each additional wiring layer in an IC may block 12-15% of the available wiring channels in each layer below; this effect is called via blockage, and is a particular problem in advanced ICs with a large number of wiring layers.

BRIEF SUMMARY

An exemplary embodiment of a signal repowering chip comprises an input; at least one inverter connected in series to the input; and at least one switch connected to a test enable signal, the at least one switch configured to allow a signal connected to the input to propagate through the at least one inverter in the event that the test enable signal is on.

An exemplary embodiment of a 3-dimensional integrated circuit comprises a first chip, the first chip comprising a default voltage level and a plurality of wiring layers; and a second chip, the second chip comprising at least one repeater, the repeater being connected to the default voltage level.

An exemplary embodiment of a method of making a 3-dimensional integrated circuit comprises providing a signal repowering chip; providing a test enable signal to the signal repowering chip; determining from an output of the signal repowering chip if the repeater chip is good; and in the event the signal repowering chip is determined to be good, attaching the signal repowering chip to a second chip to form the 3-dimensional integrated circuit.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a signal repowering chip for a 3-dimensional integrated circuit are provided, with exemplary embodiments being discussed below in detail. A 3D IC may include a signal repowering chip that is designed to be tested individually, before the chip is joined to an additional chip to form the 3D IC. In this manner, it may be ensured that the signal repowering chip is good before it is connected to an additional chip, increasing the yield of good final product 3D ICs.

Situating a signal repowering chip at the top of the 3D IC is beneficial for repowering the signal, reducing the need for vias to connect to the silicon layer. The signal repowering chip thus reduces the effects of via blockage. Additionally, the repowering chip may be used to repower signals over a voltage island. A voltage island is an area on a chip that is using a power supply that is different from the default voltage of the IC; providing, for example, a different voltage level, or a power supply that can be turned off independently of the default power supply. The signal repowering chip may comprise repeaters, which may include but are not limited to inverters or buffers. The layout of the signal repowering chip may be pre-designed on a die for simple production. The signal repowering chip may be joined with a wide variety of other chips to form 3D ICs.

Figure 1:
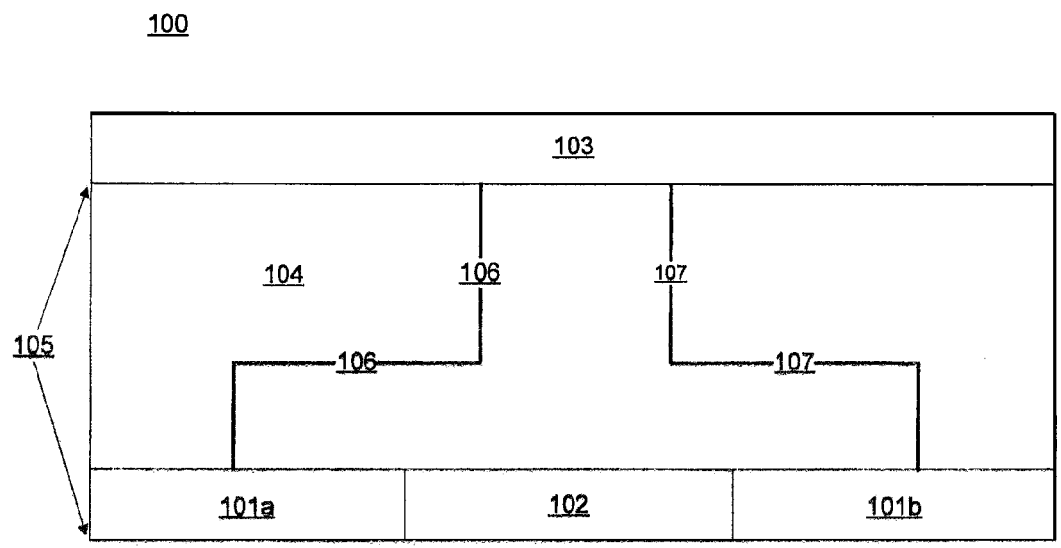
FIG. 1 illustrates an embodiment of a 3-dimensional IC.

FIG. 1 shows an embodiment of a 3D IC 100. Signal repowering chip 103 and chip 105 are connected face-to-face. Chip 105 comprises wiring layers 104; the number of wiring layers 104 may vary depending on the complexity of 3D IC 100. Signal repowering chip 103 comprises a plurality of repeaters (not shown). Default voltage islands 101a and 101b are located on the bottom of chip 105. Signal repowering chip 103 uses the default voltage from voltage islands 101a and 101b, and voltage island 102 uses a different voltage. Wires 106 and 107 connect default voltage island 101a and 101b to signal repowering chip 103, extending through wiring layers 104 of chip 105. Voltage island 102 on chip 105 may supply a different voltage to parts of IC 100, as needed. The portion of wiring layers 104 that are closer to signal repowering chip 103 may connect to signal repowering chip 103 for repowering, and the portion of wiring layers 104 that are closer to default voltage island 101a and 101b may connect to default voltage island 101a and 101b for repowering. In this manner, the total amount of wiring needed to power wiring layers 104, and via blockage in wiring layers 104, is reduced.

In embodiments of a 3D IC 100 comprising a voltage island 102, a portion of the wiring in wiring layer 104 runs on a different voltage from the default voltage. In the embodiment of FIG. 1, the default voltage is supplied by default voltage islands 101a and 101b, and the different voltage is provided by voltage island 102. The portion of the wiring powered by voltage island 102 may be turned off if desired. Typically it is not possible to drive a signal over a large voltage island 102 without repowering, as some of the logic in wiring layer 104 that may be located over the voltage island may not use the voltage available from voltage island 102, but need to be connected to the default voltage island 101a and 10 lb. The signal repowering chip 103 may supply the default voltage to portions of the wiring located over voltage island 102.

Figure 2:
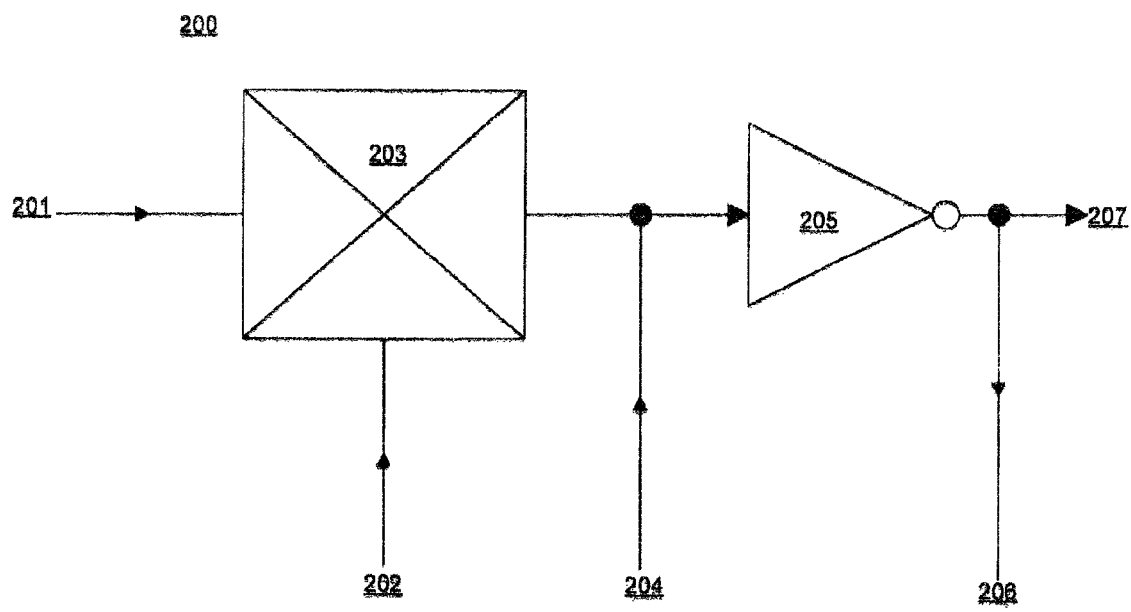
FIG. 2 illustrates an embodiment of a repeater.

FIG. 2 shows an embodiment of a repeater 200 that may be included in embodiments of a signal repowering chip 103 as shown in FIG. 1. Switch 203 comprises input voltage 201, which may be an output from another repeater or an input of the signal repowering chip, and test input 202. When test input 202 is enabled, the switch 203 propagates input 201 to inverter 205. Input buffer voltage 204 and output buffer voltage 206 are connected to a default voltage island (not shown), and may be inputs and outputs of the signal repowering chip respectively. Output 207 may be connected to another repeater or to an output of the signal repowering chip. Switch 203 may comprise an analog switch, pass gate, or transmission gate in some embodiments.

Figure 3:
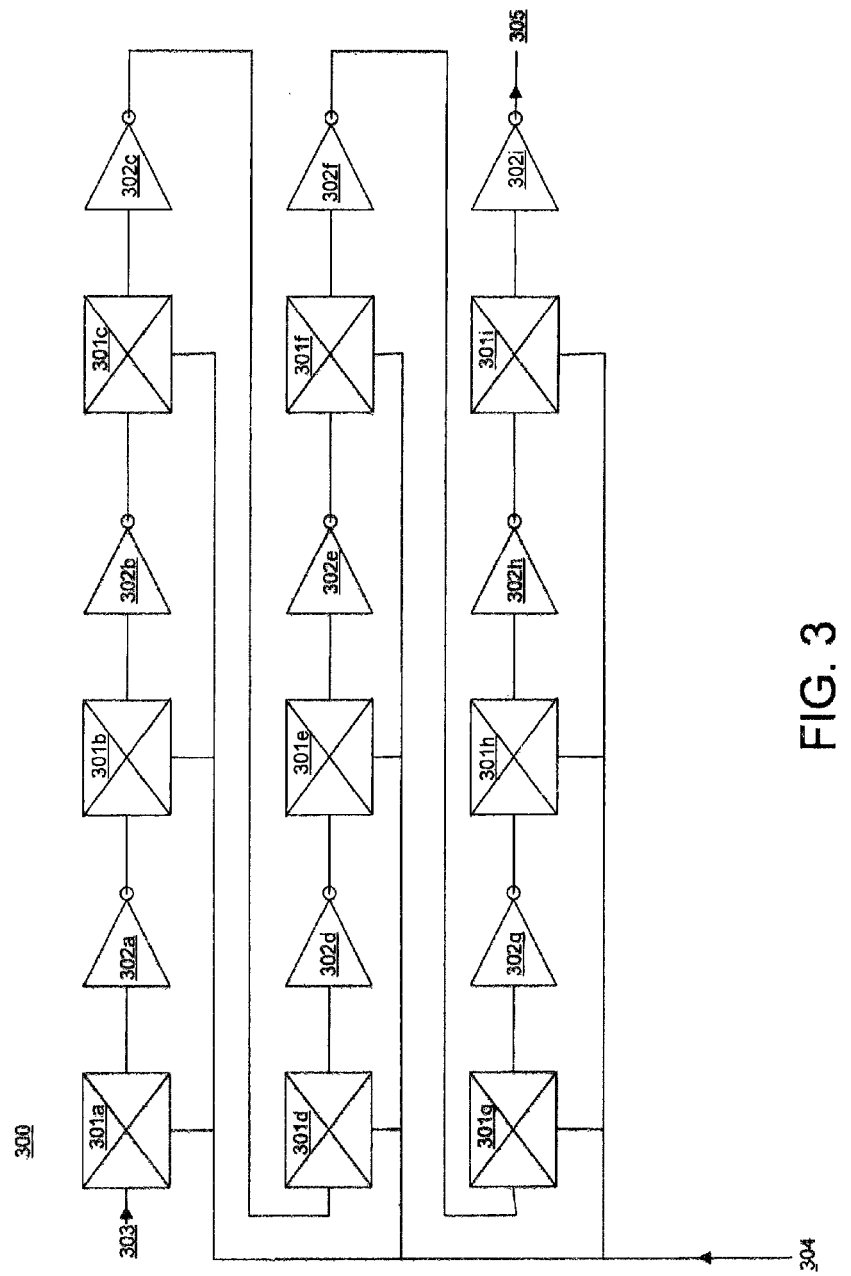
FIG. 3 illustrates an embodiment of a signal repowering chip layout.
Figure 4:
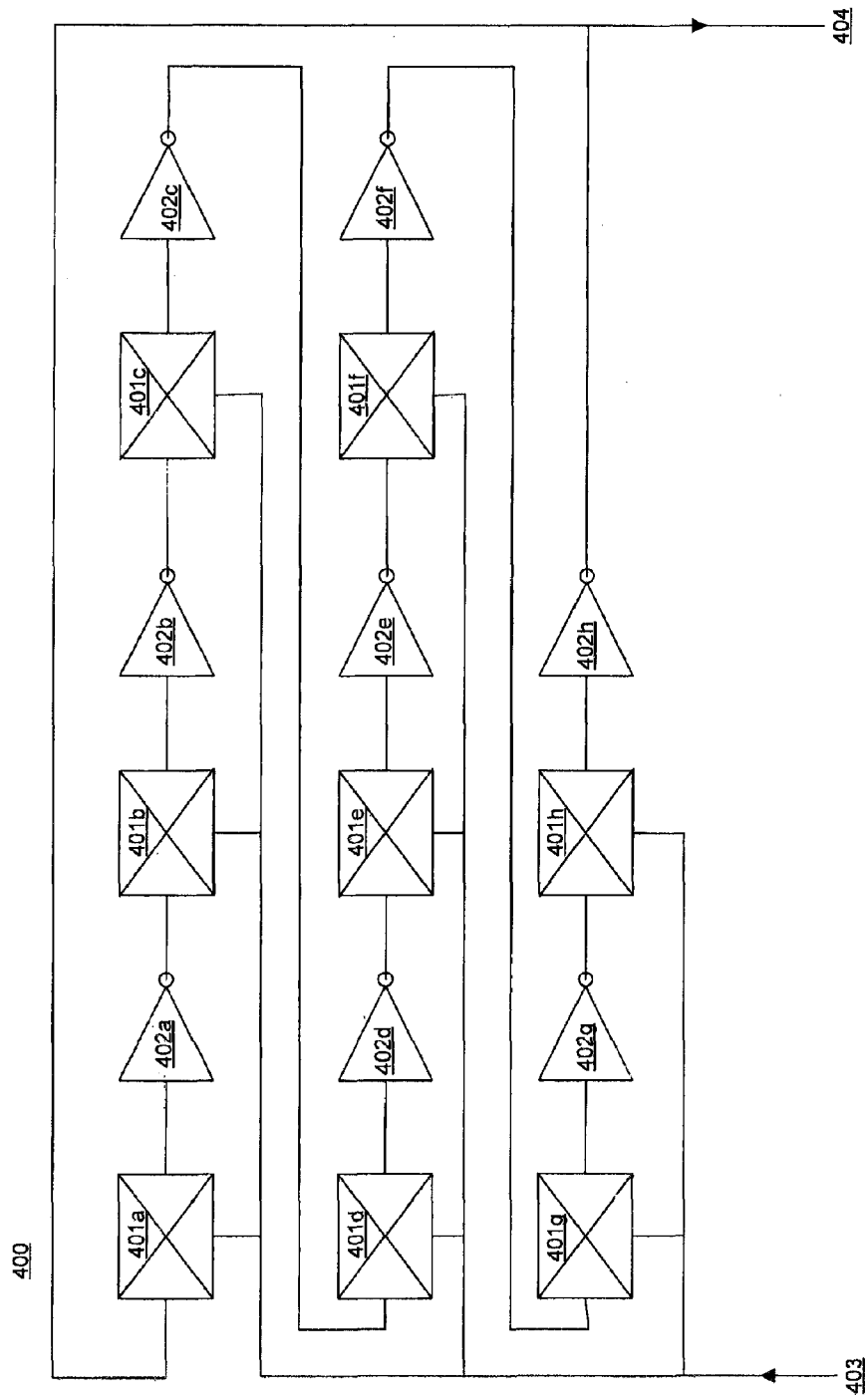
FIG. 4 illustrates an embodiment of a signal repowering chip layout.

FIG. 3 shows an embodiment of a layout 300 for a signal repowering chip. The signal repowering chip comprises input voltage 303, test input 304, and output 305. When test input 304 is enabled, switches 301a-i are closed, allowing input voltage 303 to propagate through inverters 302a-i. Output 305 may be used to determine whether the signal repowering chip is defective. FIG. 4 shows another embodiment of a layout 400 for a signal repowering chip. The signal repowering chip comprises test input 403 and output 404. Switches 401a-h and inverters 302a-h are connected in a ring. When test input 403 is enabled, test input 403 propagates through switches 401a-h and inverters 402a-h to output 404, allowing for a determination of whether the signal repowering chip is defective. Embodiments of a layout 400 for a signal repowering chip comprising an odd number of inverters result in the signal repowering chip acting as an oscillator; in such an embodiment, no input stimulus aside from the test enable signal is required to test the signal repowering chip. If oscillation is observed at a point in the ring of inverters, the repeater chip is good. Layout 300 and layout 400 for a signal repowering chip may comprise the repeater 200 shown in FIG. 2 in some embodiments. Input voltage 204 and output 206 may connect to chip 105 shown in FIG. 1 using wires 106 and 107 respectively.

A signal repowering chip may comprise regular silicon structures such as prefabricated transistors. Use of regular silicon structures may result in high yield of good signal repowering chips. Unused transistors may be switched off or disconnected from power, and inverter sizing may be possible with some given granularity. Further, embodiments of a signal repowering chip such as are shown in FIGS. 3 and 4 have no intersecting wires, making it possible to implement a repeater structure with a single wiring layer. This may reduce fabrication costs and improve yield of good signal repowering chips.

Figure 5:
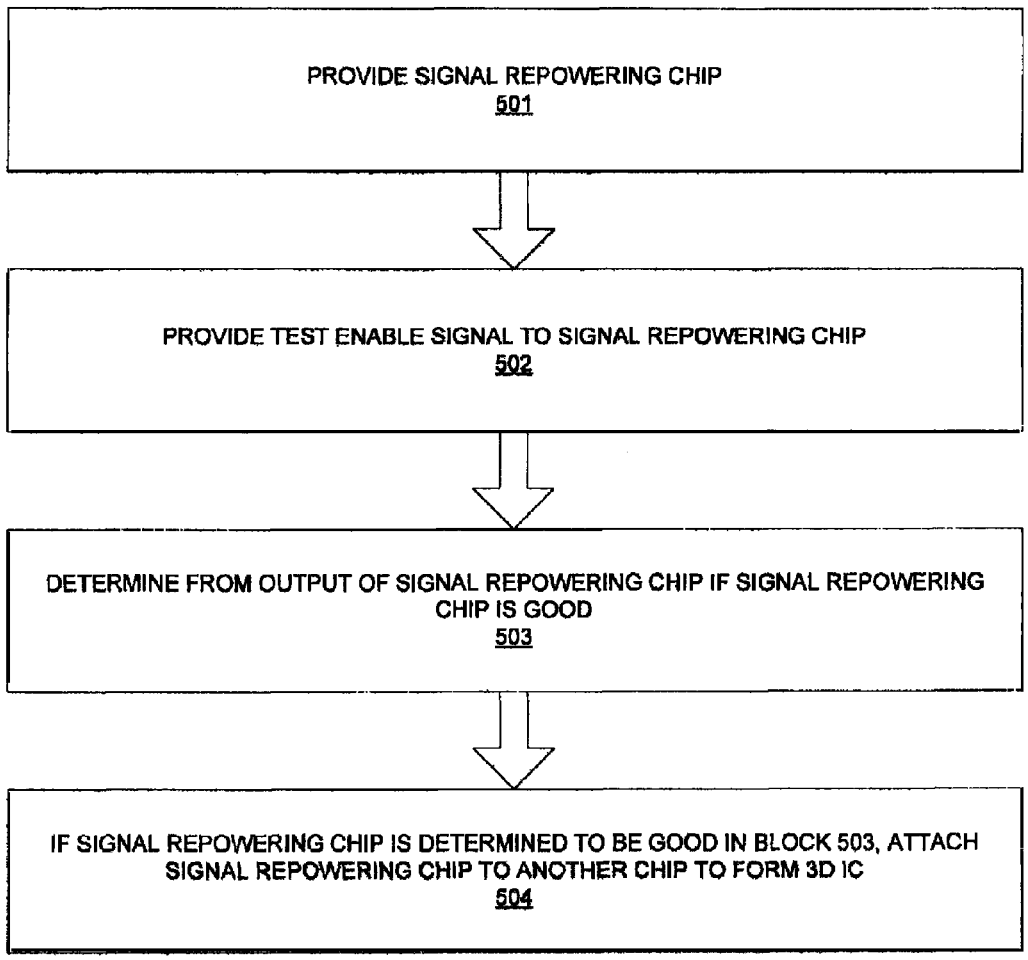
FIG. 5 illustrates an embodiment of a method of making a 3D IC chip comprising a signal repowering chip.

FIG. 5 shows an embodiment of a method 500 of making a 3D IC comprising a signal repowering chip. In block 501, a chip comprising a series of repeaters is provided. In block 502, a test enable signal is provided to the chip. In block 503, it is determined from an output of the chip whether the chip is good. In block 504, if the chip is determined to be good in block 503, the chip is attached to another chip to form a 3D IC.

The technical effects and benefits of exemplary embodiments include increased yield of good 3D ICs, and a reduction in via blockage.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A signal repowering chip comprising:
   an input;
   at least one inverter connected in series to the input; and
   at least one switch connected to a test enable signal, the at least one switch configured to allow a signal connected to the input to propagate through the at least one inverter in the event that the test enable signal is on; and
   wherein an output of the signal repowering chip is directly connected to an input of the signal repowering chip.

2. A signal repowering chip comprising:
   an input;
   at least one inverter connected in series to the input; and
   at least one switch connected to a test enable signal, the at least one switch configured to allow a signal connected to the input to propagate through the at least one inverter in the event that the test enable signal is on; and
   wherein the signal repowering chip is configured to be connected to a second chip to form a 3-dimensional integrated circuit; and
   wherein the signal repowering chip is connected to a default voltage island on the second chip.

3. The repeater chip of claim 2, wherein the signal repowering chip is configured to repower wiring connections on the second chip.

4. A 3-dimensional integrated circuit comprising:
   a first chip, the first chip comprising a default voltage level and a plurality of wiring layers; and
   a second chip, the second chip comprising at least one repeater, the repeater being connected to the default voltage level; and
   wherein the second chip is configured to be testable independently from the first chip.

5. A 3-dimensional integrated circuit comprising:
   a first chip, the first chip comprising a default voltage level and a plurality of wiring layers; and
   a second chip, the second chip comprising at least one repeater, the repeater being connected to the default voltage level; and
   wherein the second chip comprises at least one switch and at least one inverter connected in series to an input; and wherein the input of the second chip is directly connected to an output of the second chip.

* * * * *